(12) United States Patent
Tsai et al.

(10) Patent No.: US 10,629,695 B2
(45) Date of Patent: Apr. 21, 2020

(54) SEMICONDUCTOR DEVICE AND METHOD FOR FABRICATING THE SAME

(71) Applicant: UNITED MICROELECTRONICS CORP., Hsin-Chu (TW)

(72) Inventors: Shih-Hung Tsai, Tainan (TW);
Po-Kuang Hsieh, Kaohsiung (TW);
Yu-Ting Tseng, Tainan (TW);
Cheng-Ping Kuo, Pingtung County (TW); Kuan-Hao Tseng, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/239,541

(22) Filed: Jan. 4, 2019

(65) Prior Publication Data
US 2019/0140068 A1     May 9, 2019

Related U.S. Application Data

(63) Continuation of application No. 15/678,125, filed on Aug. 16, 2017, now Pat. No. 10,211,313.

(30) Foreign Application Priority Data

Jul. 17, 2017  (TW) .............................. 106123732 A

(51) Int. Cl.
*H01L 29/51* (2006.01)
*H01L 21/28* (2006.01)
(Continued)

(52) U.S. Cl.
CPC ...... *H01L 29/516* (2013.01); *H01L 21/02181* (2013.01); *H01L 21/02189* (2013.01);
(Continued)

(58) Field of Classification Search
CPC ............. H01L 29/516; H01L 21/02189; H01L 21/02181; H01L 29/4966; H01L 21/28167;
(Continued)

(56) References Cited

U.S. PATENT DOCUMENTS 8,785,995 B2   7/2014  Dubourdieu et al.
9,196,696 B2   11/2015  Xie
(Continued)

FOREIGN PATENT DOCUMENTS

CN           100550391 C       10/2009

OTHER PUBLICATIONS

Li, Title: Sub-60mV-Swing Negative-Capacitance FinFET without Hysteresis, IEEE 2015.
(Continued)

*Primary Examiner* — Victor A Mandala
(74) *Attorney, Agent, or Firm* — Winston Hsu

(57) ABSTRACT

A semiconductor device includes a metal gate on a substrate, a polysilicon layer on the metal gate, a hard mask on the polysilicon layer, and a source/drain region adjacent to two sides of the metal gate. Preferably, the metal gate includes a ferroelectric (FE) layer on the substrate, a work function metal layer on the FE layer, and a low resistance metal layer on the work function metal layer.

9 Claims, 6 Drawing Sheets

(51) Int. Cl.
*H01L 21/02* (2006.01)
*H01L 29/40* (2006.01)
*H01L 29/66* (2006.01)
*H01L 29/49* (2006.01)
*H01L 29/78* (2006.01)

(52) U.S. Cl.
CPC .. *H01L 21/02194* (2013.01); *H01L 21/02356* (2013.01); *H01L 21/28167* (2013.01); *H01L 21/28255* (2013.01); *H01L 29/408* (2013.01); *H01L 29/4966* (2013.01); *H01L 29/66545* (2013.01); *H01L 29/66795* (2013.01); *H01L 29/785* (2013.01)

(58) Field of Classification Search
CPC ......... H01L 21/02356; H01L 29/66545; H01L 29/66795; H01L 29/408; H01L 21/02194; H01L 21/28255; H01L 29/785
See application file for complete search history.

(56) References Cited

U.S. PATENT DOCUMENTS

| | | | |
|---|---|---|---|
| 9,362,283 | B2 | 6/2016 | Hong |
| 9,379,242 | B1 | 6/2016 | Lin et al. |
| 9,779,997 | B2 | 10/2017 | Li |
| 9,793,397 | B1 | 10/2017 | Ando |
| 9,831,244 | B2 | 11/2017 | Kim |
| 2008/0085591 | A1* | 4/2008 | Gomez ............... H01L 29/1066 438/585 |
| 2008/0128796 | A1* | 6/2008 | Zhu ...................... H01L 21/845 257/328 |
| 2013/0270619 | A1* | 10/2013 | Schloesser ........... H01L 29/516 257/295 |
| 2013/0330899 | A1 | 12/2013 | Bu |
| 2015/0214322 | A1 | 7/2015 | Mueller |
| 2016/0111549 | A1* | 4/2016 | Baars ................ H01L 29/78391 257/295 |
| 2016/0155748 | A1* | 6/2016 | Li ..................... H01L 29/66545 257/295 |
| 2016/0163808 | A1 | 6/2016 | Cheng |

OTHER PUBLICATIONS

Shih-Cheng Chen, Title of Invention: Semiconductor Device, U.S. Appl. No. 15/206,319, filed Jul. 11, 2016.
Kung-Hong Lee, Title of Invention: Multi-Threshold Voltage Semiconductor Device, U.S. Appl. No. 15/391,822, filed Dec. 27, 2016.

* cited by examiner

SEMICONDUCTOR DEVICE AND METHOD FOR FABRICATING THE SAME

CROSS REFERENCE TO RELATED APPLICATIONS

This is a continuation application of U.S. patent application Ser. No. 15/678,125, filed on Aug. 16, 2017, and all benefits of such earlier application are hereby claimed for this new continuation application.

BACKGROUND OF THE INVENTION

1. Field of the Invention

The invention relates to a semiconductor device, and more particularly, to a semiconductor device containing ferroelectric (FE) material.

2. Description of the Prior Art

A semiconductor device means any device which can function by utilizing semiconductor characteristics, such as an electro-optical device, a semiconductor circuit, and an electronic device. Accordingly, semiconductor devices are used in a variety of electronic applications, such as personal computers, cell phones, digital cameras, and other electronic equipment, as example.

Semiconductor devices are typically fabricated by sequentially depositing insulating or dielectric layer, conductive layers, and semiconductor layers over a semiconductor substrate, and patterning the various material layers using lithography to form circuit components and elements thereon. Since the semiconductor integrated circuit industry has experienced rapid growth and improvement, technological advances in semiconductor materials and design have produced increasingly smaller and more complex circuits. Consequently, the number of interconnected devices per unit of area has increased as the size of the smallest components that can be reliably created has decreased. However, as the size of the smallest components has decreased, numerous challenges have risen. As features become closer, current leakage can become more noticeable, signals can crossover more easily, and power usage has become a significant concern.

Typically, when a gate bias of a metal-oxide-semiconductor field effect transistor (hereinafter abbreviated as MOS FET) device is below the threshold voltage $V_{th}$, the current flow between the source and the drain, which is defined as the subthreshold current, is supposed to be zero. Or, the subthreshold current was supposed to be very small and thus in early analytical models of the electrical behavior of MOS FET were even assuming a zero off-state current/subthreshold current. Those skilled in the art should have known there is a linear relationship between the subthreshold current and the gate voltage, which is recognized as subthreshold swing (SS). A small subthreshold swing is highly desired since it improves the ratio between the on and off currents, and therefore reduces leakage currents. Using a device with a small subthreshold swing therefore has advantages such as suppression of power consumption due to reduction in operation voltage and reduction in off leakage current. However, the subthreshold swing cannot be less than 60 mV/sec due to the physical limit of MOS FET device in state-of-the-art. Thus, it is still in need to reduce the subthreshold swing despite the physical limit.

SUMMARY OF THE INVENTION

According to an embodiment of the present invention, a method for fabricating semiconductor device includes the steps of: forming a gate structure on a substrate; forming an interlayer dielectric (ILD) layer around the gate structure; removing the gate structure to form a first recess; forming ferroelectric (FE) layer in the first recess; forming a compressive layer on the FE layer; performing a thermal treatment process; removing the compressive layer; and forming a work function metal layer in the recess.

According to another aspect of the present invention, a semiconductor device includes: a metal gate on a substrate; a polysilicon layer on the metal gate; a hard mask on the polysilicon layer; and a source/drain region adjacent to two sides of the metal gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
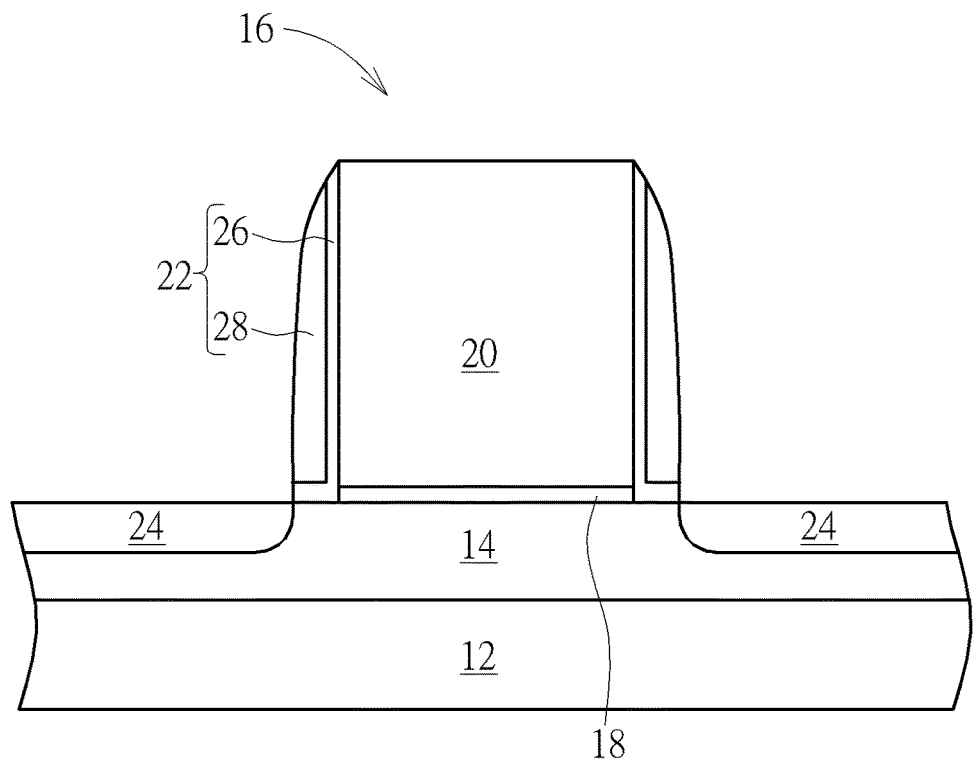
FIGS. 1-9 illustrate a method for fabricating a semiconductor device according to an embodiment of the present invention.
Figure 2:
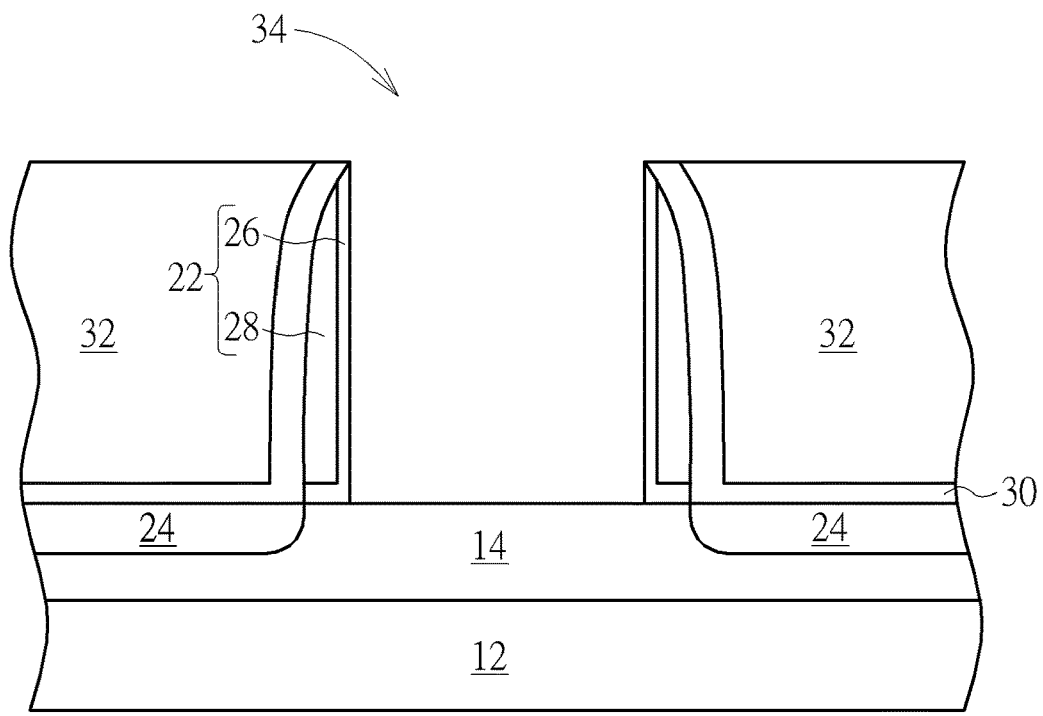

Referring to FIGS. 1-9, FIGS. 1-9 illustrate a method for fabricating a semiconductor device according to an embodiment of the present invention. As shown in FIGS. 1-2, a substrate 12, such as a silicon substrate or silicon-on-insulator (SOI) substrate is first provided, and at least a transistor region such as a NMOS region and a PMOS region are defined on the substrate 12. Next, at least a fin-shaped structure 14 is formed on the substrate 12, in which the bottom of the fin-shaped structure 14 is surrounded by an insulating layer or shallow trench isolation (STI) 22 made of material including but not limited to for example silicon oxide. It should be noted that even though this embodiment pertains to the fabrication of a non-planar FET device such as FinFET device, it would also be desirable to apply the following processes to a planar FET device, which is also within the scope of the present invention.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, at least a gate structures 16 or dummy gate is formed on the substrate 12. In this embodiment, the formation of the gate structure 16 could be accomplished by a gate first process, a high-k first approach from gate last process, or a high-k last approach from gate last process. Since this embodiment pertains to a high-k last approach, a gate dielectric layer or interfacial layer, a gate material layer, and a selective hard mask could be formed sequentially on the substrate 12, and a pattern transfer process is then conducted by using a patterned resist (not shown) as mask to remove part of the gate material layer and part of the gate dielectric layer through single or multiple etching processes. After stripping the patterned resist, a gate structure 16 composed of patterned gate dielectric layer 18 and patterned gate material layer 20 are formed on the substrate 12.

Next, at least a spacer 22 is formed on the sidewalls of the gate structure 16, a source/drain region 24 and/or epitaxial layer (not shown) is formed in the substrate 12 adjacent to two sides of the spacer 22, and a selective silicide layer (not shown) could be formed on the surface of the source/drain region 24. In this embodiment, the spacer 22 could be a single spacer or a composite spacer, such as a spacer including but not limited to for example an offset spacer 26 and a main spacer 28. Preferably, the offset spacer 26 and the main spacer 28 could include same material or different material while both the offset spacer 26 and the main spacer 28 could be made of material including but not limited to for example $SiO_2$, SiN, SiON, SiCN, or combination thereof. The source/drain region 24 could include n-type dopants or p-type dopants depending on the type of device being fabricated.

Next, as shown in FIG. 2, a contact etch stop layer (CESL) 30 is formed on the substrate 12 surface and the gate structure 16, and an interlayer dielectric (ILD) layer 32 is formed on the CESL 30 afterwards. Next, a planarizing process such as a chemical mechanical polishing (CMP) process is conducted to remove part of the ILD layer 32 and part of the CESL 30 to expose the gate material layer 20 composed of polysilicon so that the top surfaces of the gate material layer 20 and ILD layer 32 are coplanar.

Next, a replacement metal gate (RMG) process is conducted to transform the gate structure 16 into a metal gate. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 20 and even gate dielectric layer 18 from gate structure 16 for forming a recess 34 in the ILD layer 32 and exposing the surface of the fin-shaped structure 14.

Figure 3:
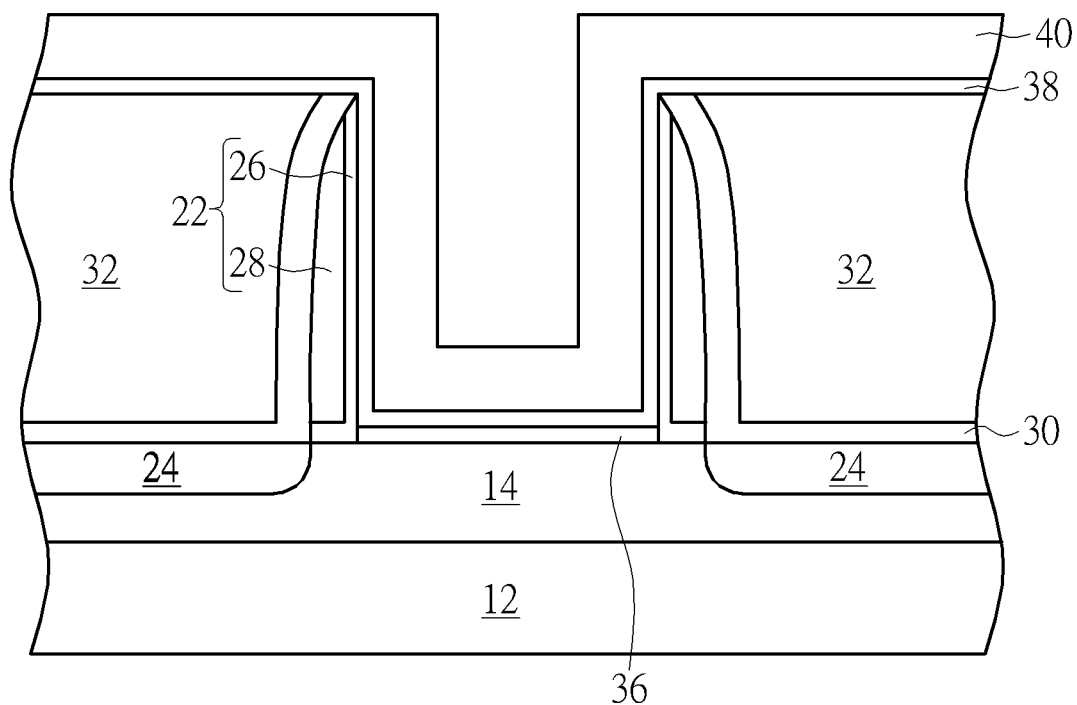

Next, as shown in FIG. 3, another interfacial layer 36 or gate dielectric layer could be selectively formed on the bottom of the recess 34, a ferroelectric (FE) layer 38 is formed in the recess 34, a compressive layer 40 is formed on the FE layer 38, and a thermal treatment process such as a rapid thermal anneal (RTA) process or post metal anneal (PMA) process is conducted so that the FE layer 38 would induce or generate a phase or crystalline state facilitating negative capacitance effect. Typically, the FE layer 38 deposited in the beginning stage includes three crystalline states or phases such as an orthorhombic phase, a tetragonal phase, and a monoclinic phase, in which the orthorhombic phase is the phase facilitating or exhibiting ferroelectric characteristics, the tetragonal phase is the phase facilitating or exhibiting anti-ferroelectric characteristics, and the monoclinic phase is the phase neither exhibiting ferroelectric characteristics nor exhibiting anti-ferroelectric characteristics. In this embodiment, if a thermal treatment process were conducted after the formation of the FE layer 38 and the compressive layer 40, it would be desirable to generate substantially more orthorhombic phase in the FE layer 38 so that the FE layer 38 would demonstrate negative capacitance characteristics.

It should be noted that even though an interfacial layer 36 is formed on the surface of the fin-shaped structure 14 within the recess 34 before forming the FE layer 38, according to an embodiment of the present invention, it would also be desirable to omit the formation of the interfacial layer 36 by forming the FE layer 38 directly into the recess 34 so that the FE layer 38 contacts the surface of the fin-shaped structure 14 directly, forming the compressive layer 40 on the FE layer 38, and then conducting a thermal treatment process, which is also within the scope of the present invention.

In some embodiments of the present invention, the FE layer 38 preferably includes $HfZrO_2$, nevertheless, according to other embodiments of the present invention, the FE layer 38 could also include a material selected from the group consisting of lead zirconate titanate ($bZrTiO_3$, PZT), lead lanthanum zirconate titanate ($PbLa(TiZr)O_3$, PLZT), strontium bismuth tantalate ($SrBiTa_2O_9$, SBT), bismuth lanthanum titanate (($BiLa)_4Ti_3O_{12}$, BLT), and barium strontium titanate ($BaSrTiO_3$, BST). The compressive layer 40 preferably includes a conductive layer having compressive stress, which could include conductive material including but not limited to for example TiN, but not limited thereto.

Figure 4:
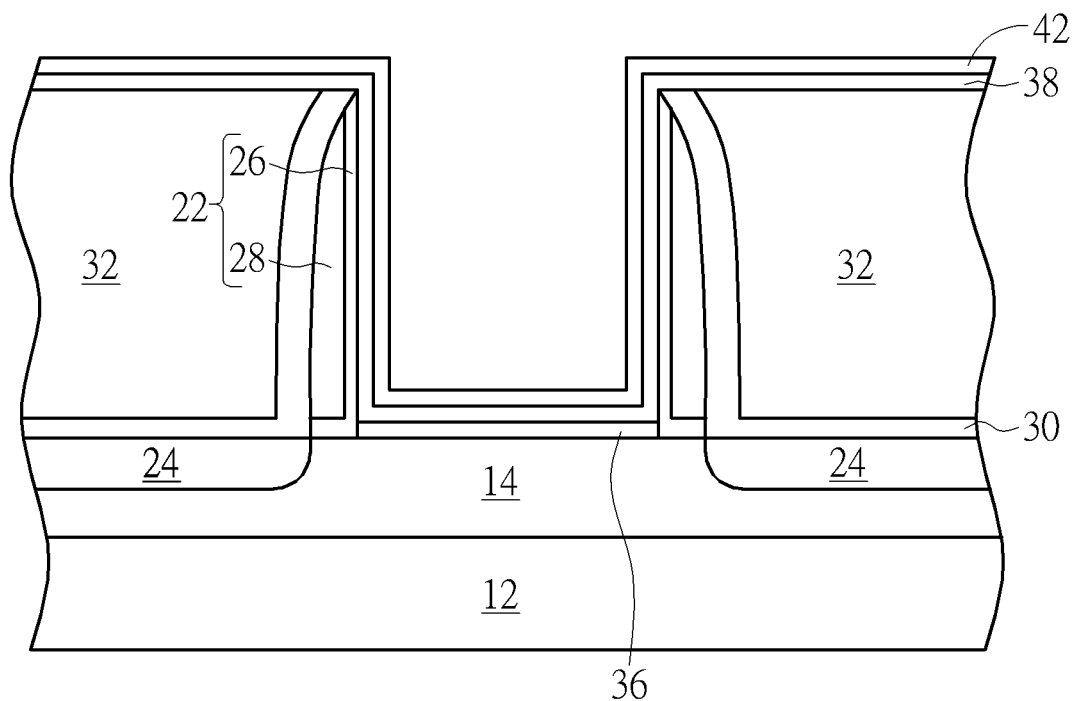

Next, as shown in FIG. 4, an etching process is conducted to remove the compressive layer 40 completely and expose the FE layer 38 underneath, and a selective bottom barrier metal (BBM) layer 42 is formed on the FE layer 38 surface. In this embodiment, the BBM layer 42 preferably includes a conductive layer having no stress, in which the BBM layer 42 could include TiN, TaN, or combination thereof.

Figure 5:
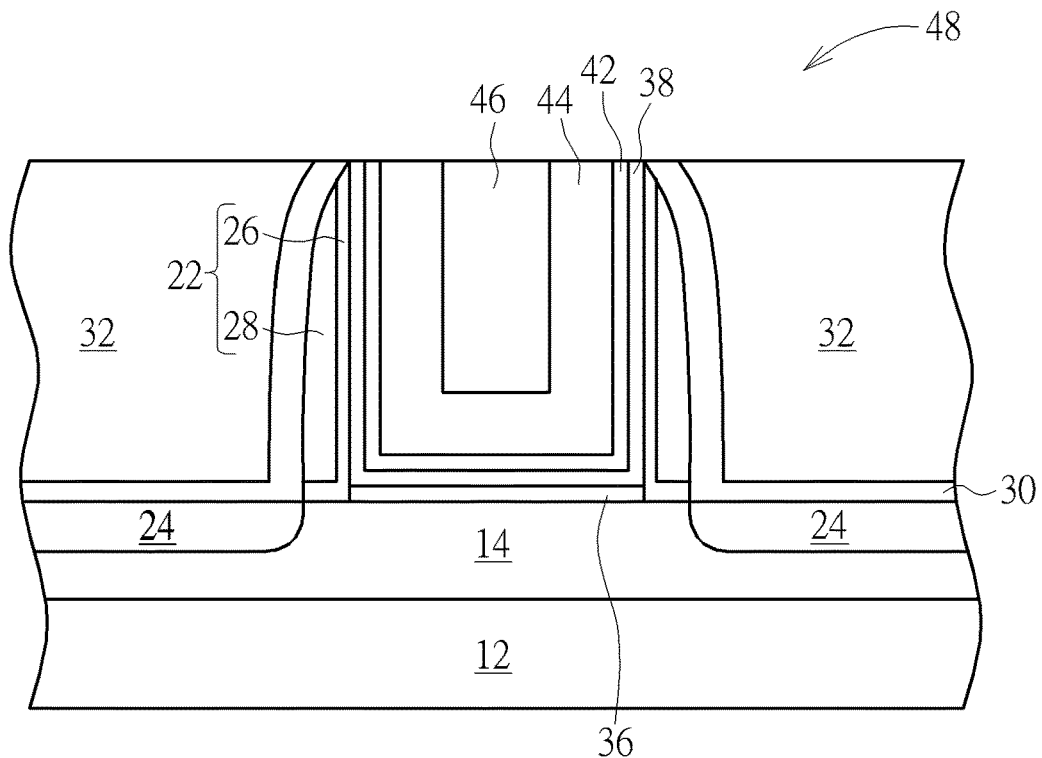

Next, as shown in FIG. 5, a work function metal layer 44 and a low resistance metal layer 46 are formed on the BBM layer 42 in the recess 34 and a planarizing process such as CMP is conducted to remove part of low resistance metal layer 46, part of work function metal layer 44, part of the BBM layer 42, and part of the FE layer 38 to form a metal gate 48. In this embodiment, the gate structure or metal gate 48 fabricated through high-k last process of a gate last process preferably includes an interfacial layer 36 or gate dielectric layer, a U-shaped FE layer 38, a U-shaped BBM layer 42, a U-shaped work function metal layer 44, and a low resistance metal layer 46. It should be noted that even though a BBM layer 42 is formed on the surface of the FE layer 38 in this embodiment before forming the work function metal layer 44, according to an embodiment of the present invention, it would also be desirable to omit the formation of the BBM layer 42 by forming the work function metal layer 44 directly on the surface of the FE layer 38 after the compressive layer 40 is removed in FIG. 4, which is also within the scope of the present invention.

In this embodiment, the work function metal layer 44 is formed for tuning the work function of the metal gate in accordance with the conductivity of the device. For an NMOS transistor, the work function metal layer 44 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 44 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 44 and the low resistance metal layer 46, in which the material of the barrier layer may include titanium (Ti), titanium nitride (TiN), tantalum (Ta) or tantalum nitride (TaN). Furthermore, the material of the low-resistance metal layer 46 may include copper (Cu), aluminum (Al), titanium aluminum (TiAl), cobalt tungsten phosphide (CoWP) or any combination thereof. This completes the fabrication of a semiconductor device according to an embodiment of the present invention.

Figure 6:
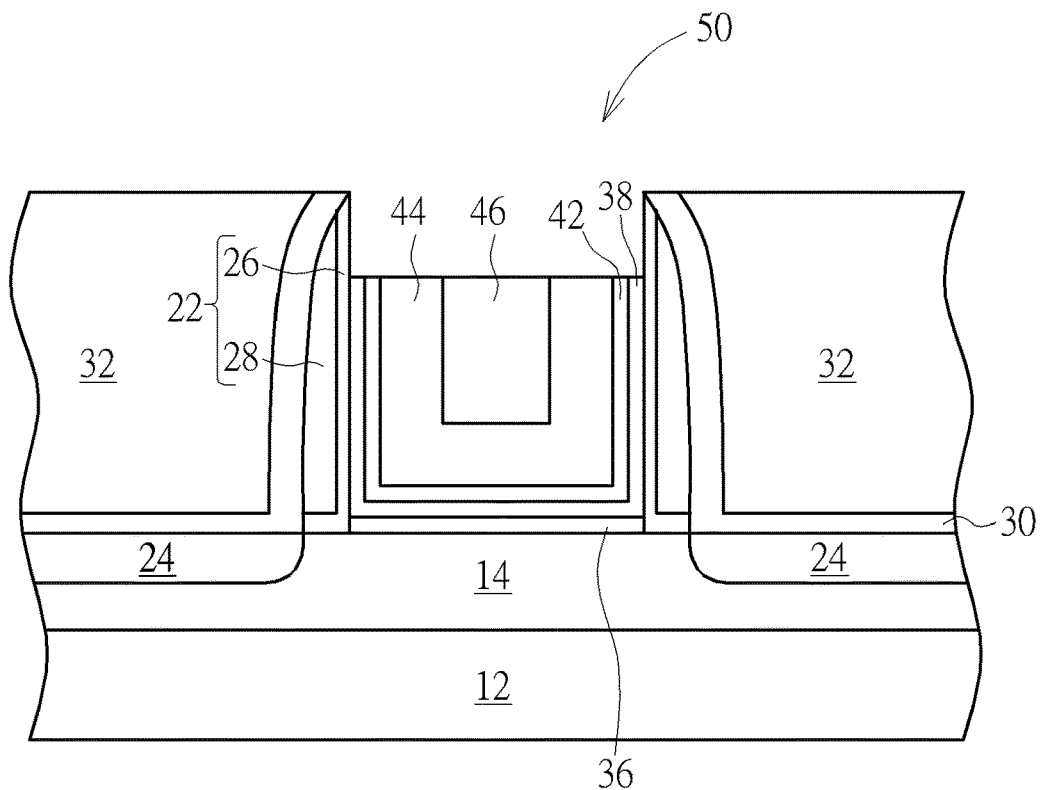

After the metal gate is completed, according to an embodiment of the present invention, as shown in FIG. 6, an etching process could be conducted to remove part of the metal gate 48 without using any patterned mask or with a patterned mask so that the top surface of the metal gate 48 is slightly lower than the top surface of the ILD layer 32. This forms another recess 50 on the metal gate 48.

Figure 7:
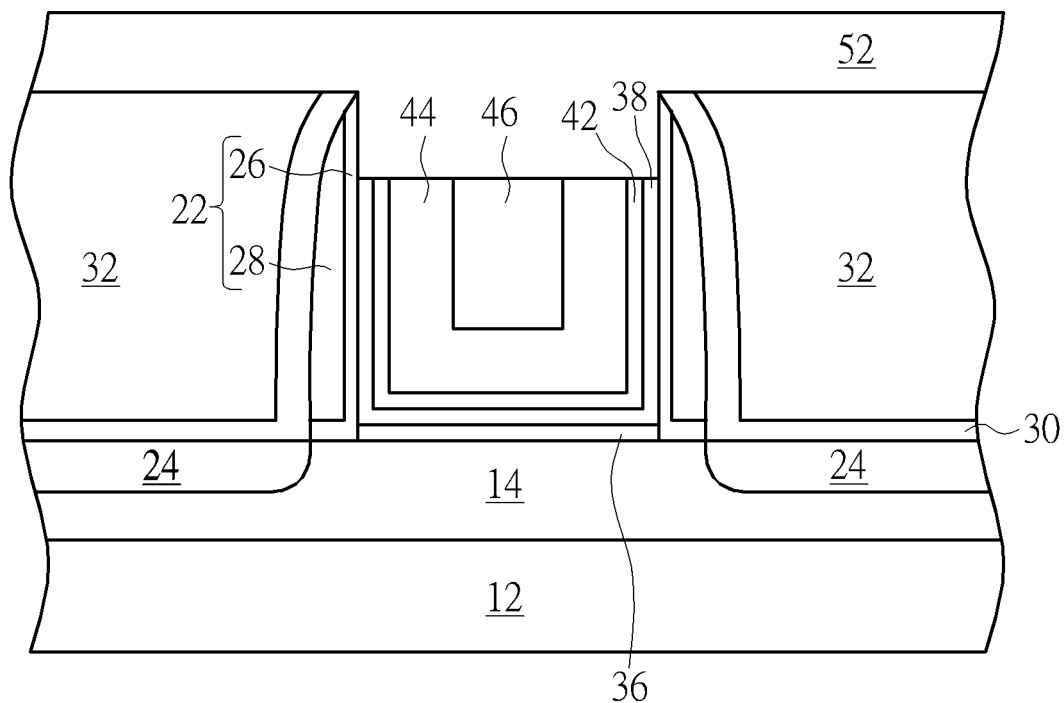

Next, as shown in FIG. 7, a semiconductor layer such as a silicon layer or polysilicon layer 52 is formed on the ILD layer 32 and fill the recess 50 entirely. In this embodiment, the polysilicon layer 52 is preferably a n-type polysilicon layer containing n-type dopants, but not limited thereto.

Figure 8:
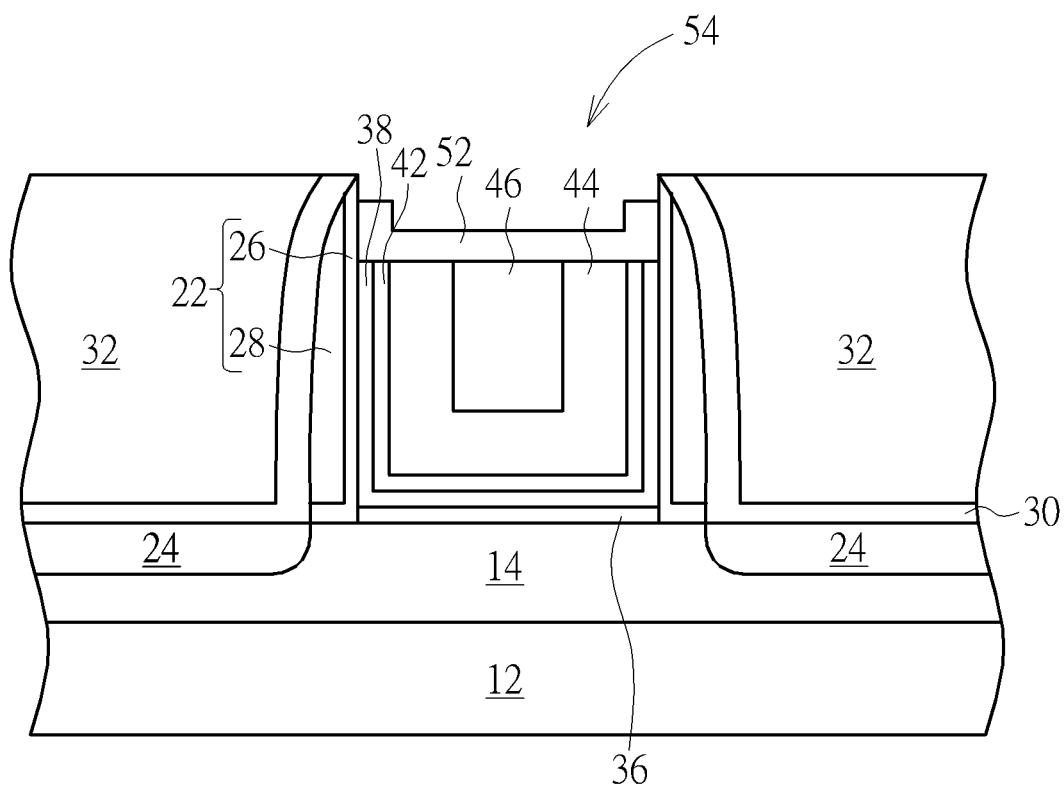

Next, as shown in FIG. 8, a planarizing process such as CMP is conducted to remove part of the polysilicon layer 52 so that the top surface of the remaining polysilicon layer 52 is even with the top surface of the ILD layer 32. Next, an etching process such as a dry etching is conducted to remove part of the polysilicon layer 52 for forming another recess 54, in which the top surface of the remaining polysilicon layer 52 is slightly lower than the top surface of the ILD layer 32.

It should be noted that a patterned mask could be formed or no patterned mask is formed during the removal of part of the polysilicon layer 52, in which the remaining polysilicon layer 52 could have an U-shaped cross-section or I-shaped cross-section depending on the parameter of the etching process and/or the position of the patterned mask being placed. In this embodiment, the polysilicon layer 52 preferably includes an U-shaped cross-section, in which the top surface of the U-shaped profile as shown in FIG. 8 is slightly lower than the top surface of the surrounding ILD layer 32. Nevertheless, the top surface of the U-shaped profile could also be even with the top surface of the ILD layer 32, which is also within the scope of the present invention.

Figure 9:
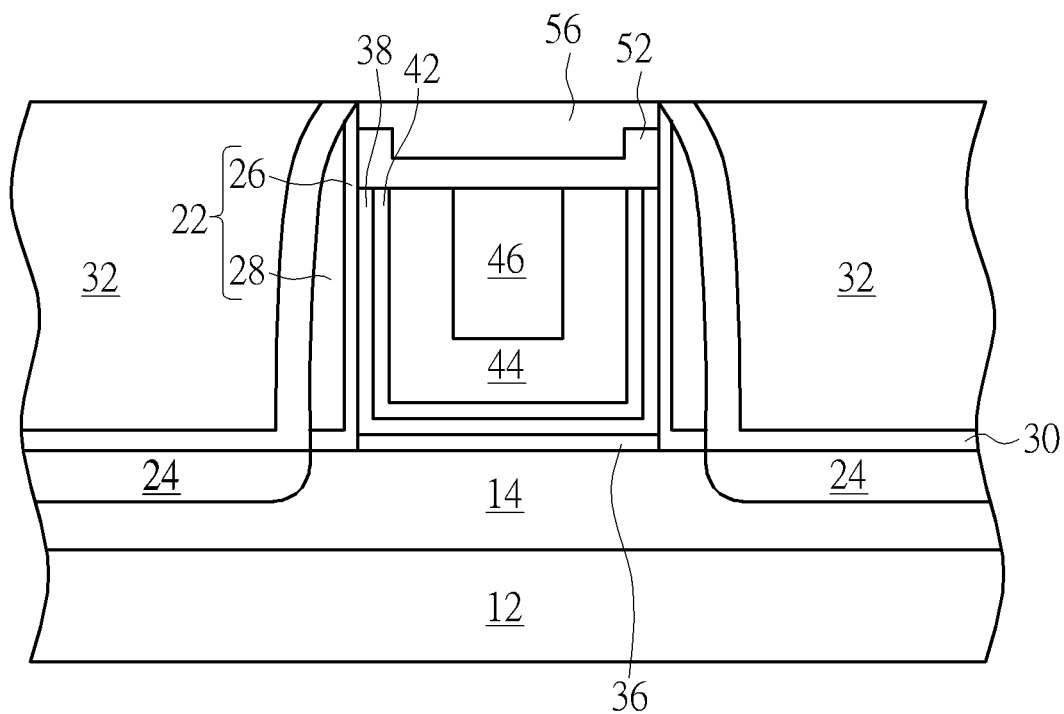

Next, as shown in FIG. 9, a hard mask 56 is formed on the polysilicon layer 52 and the ILD layer 32, and a planarizing process such as CMP is conducted to remove part of the hard mask 56 so that the top surface of the remaining hard mask 56 is even with the top surface of the ILD layer 32. In this embodiment, the hard mask 56 preferably includes SiN, but could also be made of other dielectric material including but not limited to for example $SiO_2$, SiON, SiCN, or combination thereof. Next, a contact plug formation could be conducted to form contact plugs (not shown) in the ILD layer 32 adjacent to two sides of the spacer 22 for electrically connecting the source/drain region 24. This completes the fabrication of a semiconductor device according to an embodiment of the present invention.

Figure 10:
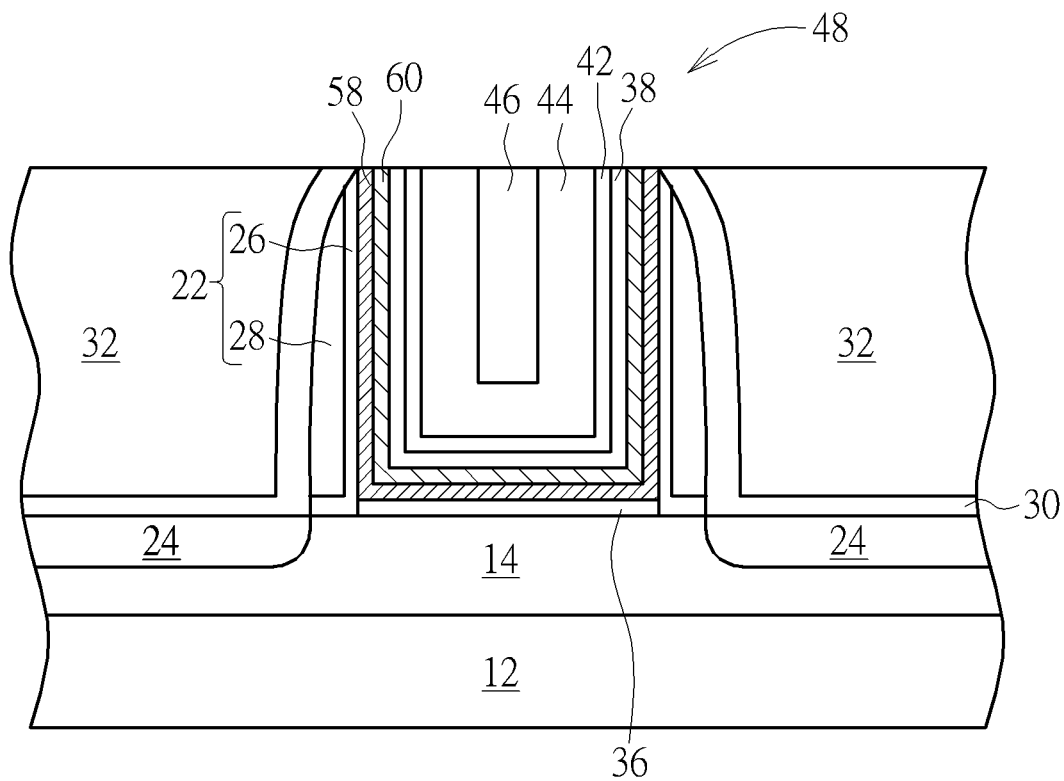
FIG. 10 illustrates a structural view of a semiconductor device according to an embodiment of the present invention.

Referring to FIG. 10, FIG. 10 illustrates a structural view of a semiconductor device according to an embodiment of the present invention. As shown in FIG. 10, it would be desirable to form a high-k dielectric layer 58 and a BBM layer 60 in the recess 34 before forming the FE layer 38 as shown in FIG. 3, and then form the FE layer 38 on the BBM layer 60, form a compressive layer (not shown) on the FE layer 38, and conduct a thermal treatment process such as RTA process or PMA process so that the FE layer 38 could reveal negative capacitance characteristics. Moreover, according to an embodiment of the present invention, it would also be desirable to omit the step of forming the BBM layer 60 after the formation of high-k dielectric layer 58 so that the FE layer 38 would be formed to directly contact the surface of the high-k dielectric layer 58, which is also within the scope of the present invention.

Next, fabrication process from FIGS. 4-5 are conducted by first using an etching process to remove the compressive layer completely and expose the FE layer 38 underneath, forming a BBM layer 42 on the FE layer 38, forming a work function metal layer 44 and a low resistance metal layer 46 on the BBM layer 42 to fill the recess 34, and conducting a planarizing process such as CMP to remove part of the low resistance metal layer 46, part of the work function metal layer 44, part of the BBM layer 42, part of the FE layer 38, part of the BBM layer 60, and part of the high-k dielectric layer 58 to form a metal gate 48.

Similar to the aforementioned embodiment, even though a BBM layer 42 is formed on the surface of the FE layer 38 before forming the work function metal layer 44 in this embodiment, according to an embodiment of the present invention, it would also be desirable to omit the formation of the BBM layer 42 by forming the work function metal layer 44 directly on the surface of the FE layer 38 as soon as the compressive layer 40 is removed, which is also within the scope of the present invention. According to yet another embodiment of the present invention, an additional barrier layer (not shown) could also be formed between the work function metal layer 44 and the low resistance metal layer 46, in which the barrier layer could include Ti, TiN, Ta, TaN, or combination thereof.

In this embodiment, the high-k dielectric layer 58 is preferably selected from dielectric materials having dielectric constant (k value) larger than 4. For instance, the high-k dielectric layer 58 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Figure 11:
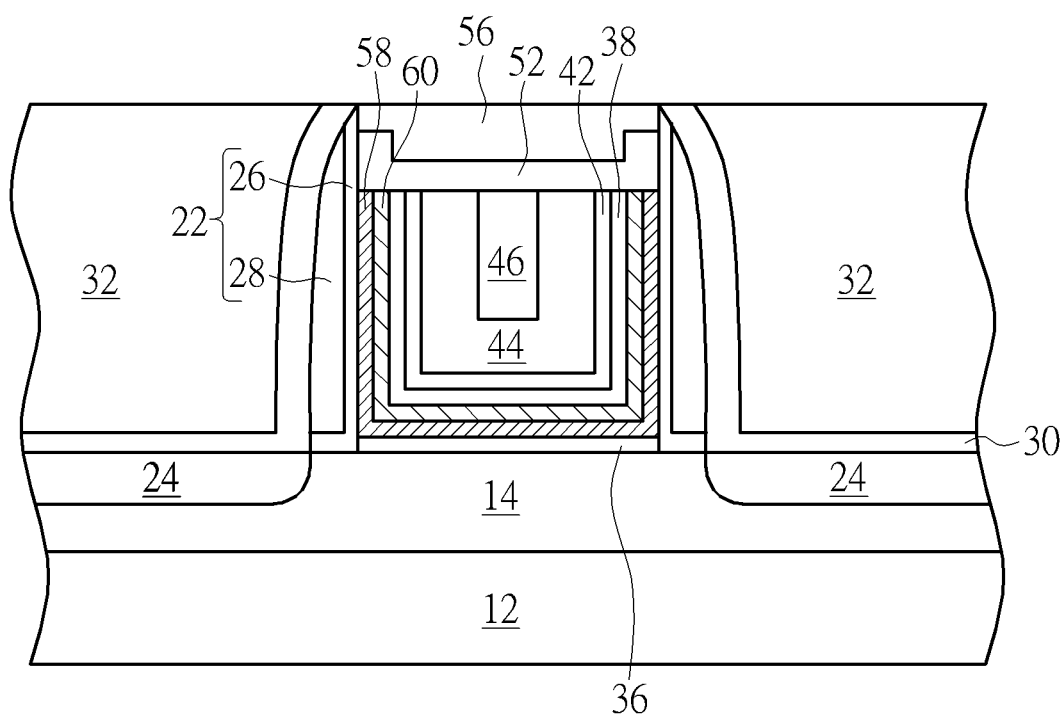
FIG. 11 illustrates a structural view of a semiconductor device according to an embodiment of the present invention.

Referring to FIG. 11, FIG. 11 illustrates a structural view of a semiconductor device according to an embodiment of the present invention. As shown in FIG. 11, it would be desirable to combine the structure from FIG. 10 with process from FIGS. 6-9 by first removing part of the metal gate 48 to form a recess, forming a polysilicon layer 52 in the recess and on the ILD layer 32, conducting a planarizing process along with an etching back process to remove part of the polysilicon layer 52, and then forming a hard mask 56 on the polysilicon layer 52. Similar to the aforementioned embodiment, the polysilicon layer 52 could have a U-shaped cross-section or an I-shaped cross-section depending on the demand of the product and if the polysilicon layer 52 were to have an U-shaped cross-section, the topmost surface of the U-shaped profile of the polysilicon layer 52 could be slightly lower than the top surface of the ILD layer 32 or even with the top surface of the ILD layer 32, which are all within the scope of the present invention.

Overall, the present invention preferably removes the dummy gate to form a recess during RMG process, forms a FE layer and a compressive stress layer in the recess, and then conducts a thermal treatment process so that the FE layer generates crystalline state or phase with negative capacitance characteristics. By doing so, the subthreshold swing of the device and current leakage issue of the device could be improved substantially. Moreover, after conducting the aforementioned thermal process so that the FE layer could generate more crystalline phase facilitating negative capacitance, the compressive stress is layer is removed completely through etching so that more space is created for layers such as work function metal layer and low resistance metal layer deposited afterwards.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a metal gate on a substrate;
    a polysilicon layer on the metal gate, wherein a thickness of the polysilicon layer is less than a thickness of the metal gate and the polysilicon layer is a non-inverted U-shape;
    a hard mask on the polysilicon layer; and
    a source/drain region adjacent to two sides of the metal gate.

2. The semiconductor device of claim 1, further comprising:
    a fin-shaped structure on the substrate; and
    the metal gate on the fin-shaped structure, wherein the fin-shaped structure comprises silicon germanium.

3. The semiconductor device of claim 1, wherein the metal gate comprises:
    a ferroelectric (FE) layer on the substrate;
    a work function metal layer on the FE layer; and
    a low resistance metal layer on the work function metal layer.

4. The semiconductor device of claim 3, wherein the FE layer comprises $HfZrO_2$.

5. The semiconductor device of claim 3, wherein the FE layer and the work function metal layer are U-shaped.

6. The semiconductor device of claim 3, further comprising:
    a high-k dielectric layer between the FE layer and the substrate; and
    a bottom barrier metal (BBM) layer between the high-k dielectric layer and the FE layer.

7. The semiconductor device of claim 1, wherein the polysilicon layer comprises a n-type polysilicon layer.

8. The semiconductor device of claim 1, further comprising an interlayer dielectric (ILD layer around the metal gate, wherein the top surfaces of the ILD layer and the hard mask are coplanar.

9. The semiconductor device of claim 1, wherein the hard mask comprises silicon nitride.

* * * * *